(12) United States Patent
Oboukhov et al.

(10) Patent No.: US 11,411,584 B2
(45) Date of Patent: Aug. 9, 2022

(54) DATA STORAGE DEVICE CHANNEL ENCODING CURRENT DATA USING REDUNDANCY BITS GENERATED OVER PRECEDING DATA

(71) Applicant: Western Digital Technologies, Inc., San Jose, CA (US)

(72) Inventors: Iouri Oboukhov, Rochester, MN (US); Richard L. Galbraith, Rochester, MN (US); Niranjay Ravindran, Rochester, MN (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/179,542

(22) Filed: Feb. 19, 2021

(65) Prior Publication Data

US 2022/0103188 A1 Mar. 31, 2022

Related U.S. Application Data

(60) Provisional application No. 63/084,094, filed on Sep. 28, 2020.

(51) Int. Cl.
*H03M 13/29* (2006.01)
*H03M 13/11* (2006.01)

(52) U.S. Cl.
CPC ... *H03M 13/2942* (2013.01); *H03M 13/1105* (2013.01); *H03M 13/1177* (2013.01)

(58) Field of Classification Search
CPC ......... H03M 13/2942; H03M 13/1177; H03M 13/1105; G11C 29/52
See application file for complete search history.

(56) References Cited

U.S. PATENT DOCUMENTS

| | | | |
|---|---|---|---|
| 5,731,768 A | 3/1998 | Tsang | |
| 5,838,698 A * | 11/1998 | Doubler | H04L 1/0057 714/800 |
| 5,859,601 A * | 1/1999 | Moon | H03M 5/145 341/59 |
| 5,993,056 A * | 11/1999 | Vaman | H03M 13/11 714/755 |

(Continued)

OTHER PUBLICATIONS

Jaekyun Moon and B. Brickner, "Maximum transition run codes for data storage systems," in IEEE Transactions on Magnetics, vol. 32, No. 5, pp. 3992-3994, Sep. 1996.*

*Primary Examiner* — Steve N Nguyen

(74) *Attorney, Agent, or Firm* — Patterson + Sheridan, LLP; Steven H. Versteeg

(57) ABSTRACT

A data storage device is disclosed comprising a non-volatile storage medium (NVSM). A first block of data is channel encoded into first channel data based on a channel code constraint, and the first channel data is error correction encoded to generate first redundancy bits. A second block of data is channel encoded into second channel data based on the channel code constraint and the first redundancy bits, and the first channel data and the second channel data are error correction encode to generate second redundancy bits. A third block of data is channel encoded into third channel data based on the channel code constraint and the second redundancy bits. The first, second and third channel data and the first and second redundancy bits are stored in the NVSM.

24 Claims, 7 Drawing Sheets

(56) References Cited

U.S. PATENT DOCUMENTS

| | | | |
|---|---|---|---|
| 6,226,769 B1 * | 5/2001 | Schuster | H03M 13/2703 |
| | | | 714/752 |
| 6,243,847 B1 | 6/2001 | McClellan et al. | |
| 6,526,530 B1 | 2/2003 | Nazari et al. | |
| 7,530,003 B2 | 5/2009 | Lee et al. | |
| 8,321,769 B1 | 11/2012 | Yeo et al. | |
| 8,599,959 B2 | 12/2013 | Krachkovsky et al. | |
| 8,972,838 B2 * | 3/2015 | Tu | G06F 11/1004 |
| | | | 714/821 |
| 2002/0184590 A1 * | 12/2002 | Ramaswamy | H03M 13/2906 |
| | | | 714/752 |
| 2008/0195915 A1 * | 8/2008 | Leonard | H03M 13/09 |
| | | | 714/757 |
| 2015/0363268 A1 * | 12/2015 | Chandra | G06F 11/0751 |
| | | | 714/801 |
| 2017/0302299 A1 * | 10/2017 | Lin | G06F 11/1012 |
| 2019/0319645 A1 * | 10/2019 | Tran Thai | H03M 13/373 |

\* cited by examiner

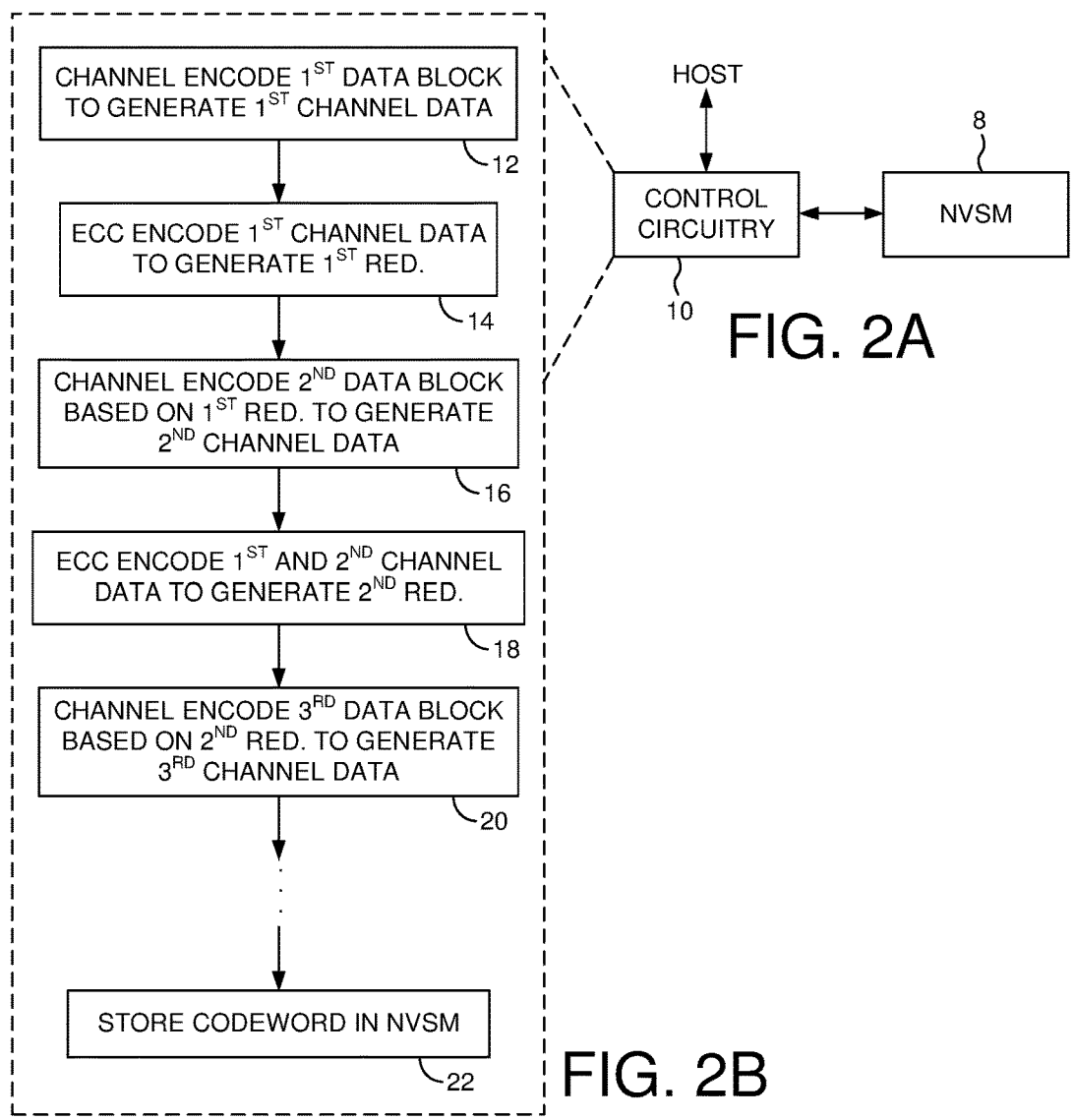
FIG. 2A
FIG. 2B
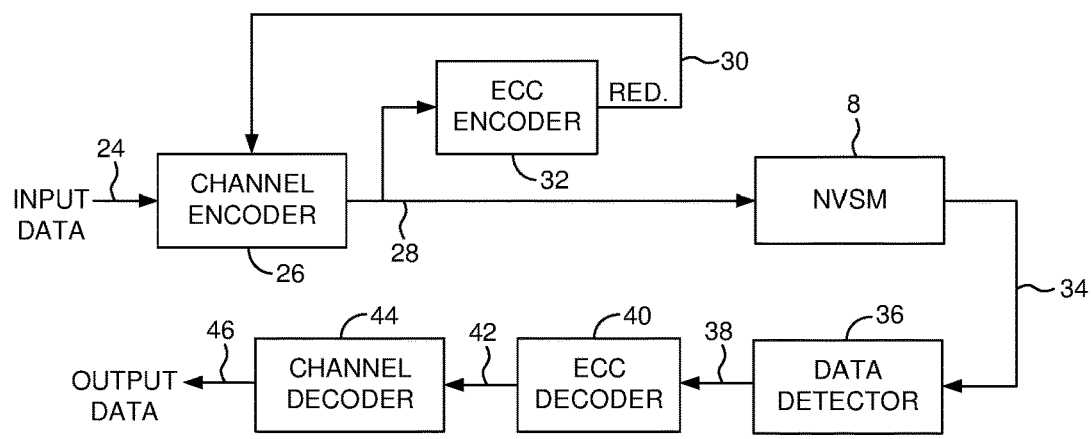
FIG. 2C

FIG. 8

DATA STORAGE DEVICE CHANNEL ENCODING CURRENT DATA USING REDUNDANCY BITS GENERATED OVER PRECEDING DATA

CROSS REFERENCE TO RELATED APPLICATIONS

This application claims priority to U.S. Provisional Patent Application Ser. No. 63/084,094, filed on Sep. 28, 2020, which is hereby incorporated by reference in its entirety.

BACKGROUND

Data storage devices such as disk drives, tape drives, and solid state drives typically employ some form of error correction code (ECC) capable of correcting errors when reading the recorded data from the storage medium, thereby compensating for signal noise that is inherent with every recording/reproduction channel. During a write operation, redundancy symbols are generated and appended to user data which are then processed during a corresponding read operation in order to detect and correct errors in the user data. A channel code may also be employed which encodes the data prior to recording in order to achieve any suitable channel code constraint, such as limiting the maximum number of consecutive one bits which may represent, for example, consecutive magnetic transitions recorded on a magnetic tape or magnetic disk storage medium, thereby reducing the effect of partial erasure. This channel code constraint is commonly referred to as a maximum transition run (MTR) code constraint. Another well known channel code constraint is the run length limited (RLL) code constraint which may limit the number of consecutive zero bits in order to maintain proper timing recovery.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the symbols of a single codeword, or in other embodiments, each data sector may store symbols from multiple codewords (i.e., interleaved codewords). FIG. 1B shows a prior art die format for a solid state drive, wherein each die may store multiple pages and each page may store multiple blocks each corresponding to a data sector of a disk drive, and the pages may be grouped into erase blocks for garbage collection and wear leveling management. FIG. 1C shows a magnetic tape which may be recorded as longitudinal data tracks using a head bar comprising multiple write/read elements, wherein codewords may be written to the data tracks using any suitable format (sequential, interleaved, distributed, etc.).

BRIEF DESCRIPTION OF THE DRAWINGS

FIG. 2A shows a data storage device according to an embodiment comprising control circuitry and a non-volatile storage medium (NVSM).

FIG. 2B is a flow diagram according to an embodiment wherein input data is channel encoded based on a channel code constraint and based on error correction code (ECC) redundancy bits generated over previous channel data.

FIG. 2C shows a recording channel according to an embodiment wherein the ECC redundancy bits generated over channel data is fed back into a channel encoder for encoding a next input block of data.

FIG. 8 shows an embodiment wherein the ECC implements a low density parity check (LDPC) code having a triangular H-matrix.

DETAILED DESCRIPTION

Figure 1A:
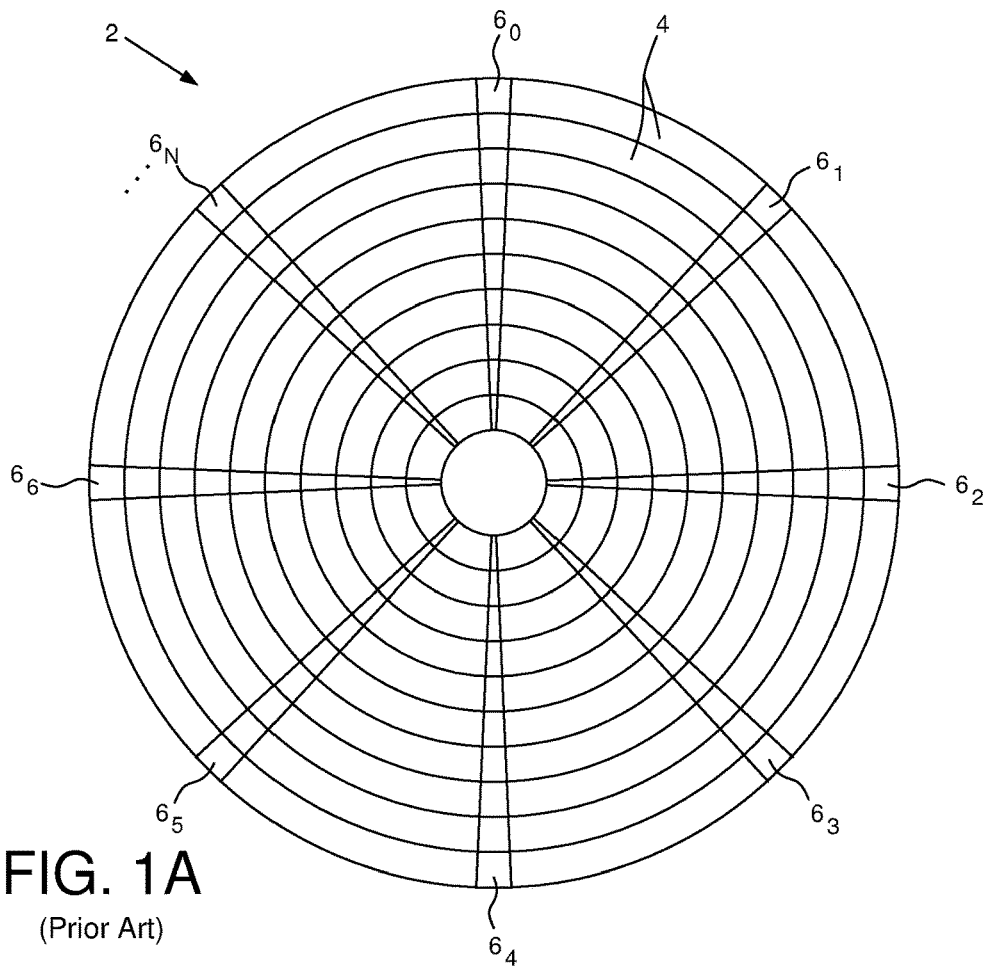
FIG. 1A shows a prior art disk format comprising a plurality of servo tracks defined by servo sectors.
Figure 1B:
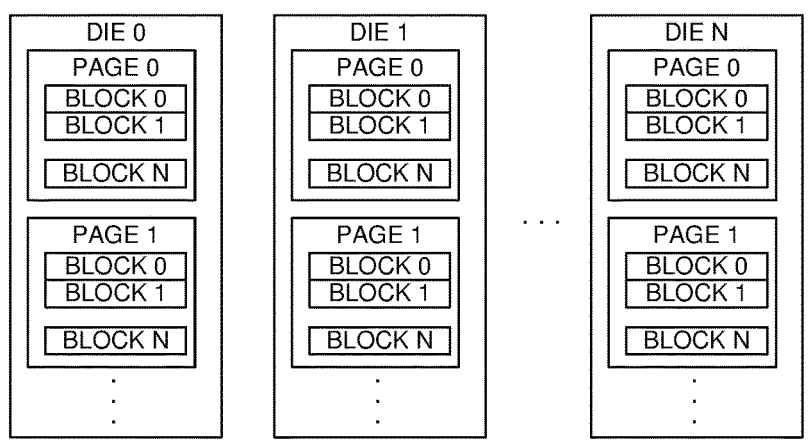
FIG. 1B shows a prior art solid state drive format comprising a plurality of dies each comprising a plurality of pages.
Figure 1C:
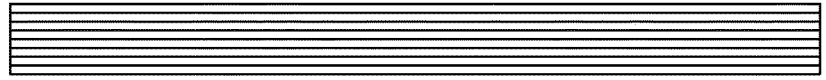
FIG. 1C shows a prior art magnetic tape comprising a plurality of longitudinal data tracks.

FIG. 2A shows a data storage device according to an embodiment comprising a non-volatile storage medium (NVSM) 8, and control circuitry 10 configured to execute the flow diagram of FIG. 2B. The data storage device may include one or more types of NVSM, including rotating magnetic media (e.g., a hard disk drive), magnetic tape media (e.g., tape drive), and solid state memory (e.g., a solid state drive). While the description herein refers to solid state memory generally, it is understood that solid state memory may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., Single-Level Cell (SLC) memory, Multi-Level Cell (MLC) memory, TLC, QLC, etc., or any combination thereof), NOR memory, EEPROM, Ferroelectric Memory (FeRAM), Magneto-resistive RAM (MRAM), other discrete NVM chips, or any combination thereof. A first block of data is channel encoded into first channel data based on a channel code constraint (block 12), and the first channel data is error correction encoded to generate first redundancy bits (block 14). A second block of data is channel encoded into second channel data based on the channel code constraint and the first redundancy bits (block 16), and the first and second channel data are error correction encoded to generate second redundancy bits (block 18). A third block of data is channel encoded into third channel data based on the channel code constraint and the second redundancy bits (block 20), and so on, thereby generating an ECC codeword that is stored in the NVSM (block 22).

FIG. 2C shows an overview of a recording channel according to an embodiment wherein input data 24 is encoded by a channel encoder 26 to generate channel data 28. The channel encoder 26 encodes the input data 24 based on any suitable channel code constraint (e.g., MTR, RLL, etc.) and based on redundancy bits 30 generated by encoding previous channel data 28 using any suitable ECC encoder 32, wherein the channel data 28 forming an ECC codeword is stored in the NVSM 8. The stored data is read from the NVSM 8 and the read signal 34 processed by any suitable data detector 36. The detected data 38 is decoded using any suitable ECC decoder 40 to generate a decoded ECC codeword 42 which is decoded into output data 46 by a channel decoder 44 implementing the inverse of the channel encoder 26.

Figure 3A:
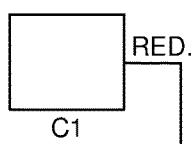
FIGS. 3A-3E show an embodiment wherein ECC redundancy bits generated over previous channel data are encoded into current channel data.
Figure 3B:
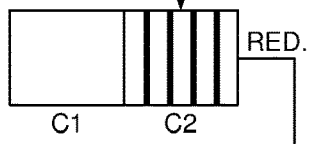
Figure 3C:
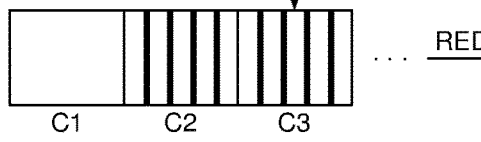
Figure 3D:
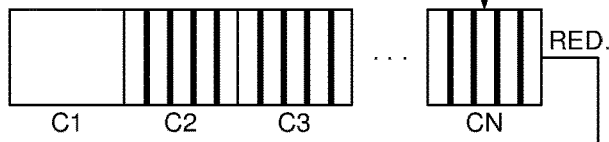
Figure 3E:
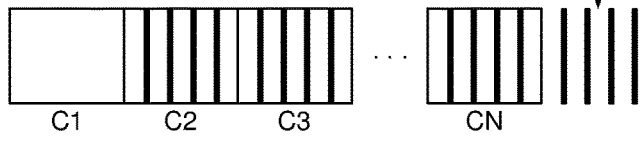

FIGS. 3A-3E show an example embodiment of encoding the input data into channel data based on a channel code constraint and based on the ECC redundancy bits generated over previously encoded channel data. In FIG. 3A, a first input block is channel encoded into a first channel block C1 based on the channel code constraint. In FIG. 3B, a second input block is encoded into a second channel block C2 based on the channel code constraint and based on the redundancy bits generated by ECC encoding the first channel block C1. In this embodiment, the second channel block C2 is encoded so as to comprise the ECC redundancy bits, that is, the ECC redundancy bits are effectively embedded into the second channel block C2. In the example of FIG. 3B, the ECC redundancy bits are distributed across the second channel block C2 as represented by the plurality of black stripes, wherein each stripe may comprise one or more ECC redundancy bits. In this embodiment, the ECC redundancy bits are encoded into the second channel block C2 so that the resulting channel data does not violate the channel code constraint. Also in this embodiment, the channel encoder generates the second channel block C2 so that the channel code constraint is not violated at the boundary between the first channel block C1 and the second channel block C2. This process continues as shown in FIG. 3C in order to encode a third input block into a third channel block C3 having embedded therein the ECC redundancy bits generated over the first channel block C1 and the second channel block C2. This process is repeated until the last input block of an ECC codeword is encoded into the last channel block CN as shown in FIG. 3D, wherein the ECC redundancy bits generated over all of the previous channel data blocks and the last channel data block CN as shown in FIG. 3E are appended at the end of the ECC codeword.

In one embodiment, the last block of ECC redundancy bits are appended at the end of the ECC codeword as shown in FIG. 3E without modification which means the last block of ECC redundancy bits may violate the channel code constraint. However in one embodiment the last block of ECC redundancy bits represents a small percentage of the overall ECC codeword and therefore violating the code constraint over this small block of data does not significantly degrade the performance of the recording channel. In another embodiment, the last block of ECC redundancy bits may be encoded so as to satisfy the channel code constraint. During a read operation, the last block of encoded redundancy bits detected by the data detector 36 in FIG. 2C is decoded by an inverse decoder and the decoded redundancy bits processed by the ECC decoder 40 to decode the ECC codeword.

Figure 4A:
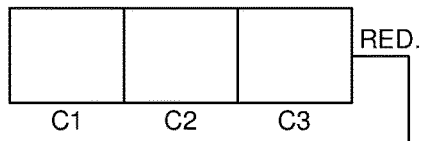
FIGS. 4A-4E show an embodiment wherein ECC redundancy bits are generated over a predetermined number of the beginning channel data blocks in order to increase the correction power of the ECC.
Figure 4B:
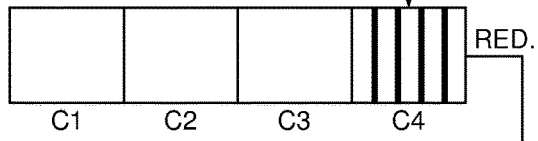
Figure 4C:
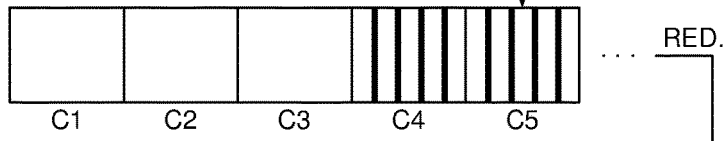
Figure 4D:
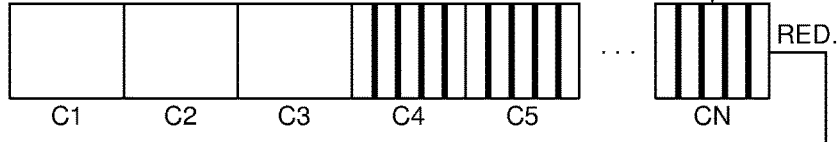
Figure 4E:
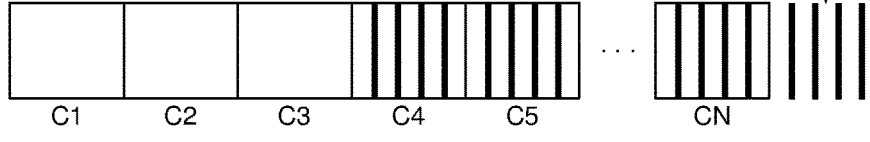

FIGS. 4A-4E show an alternative embodiment for encoding the input data into channel data wherein ECC redundancy is generated over a plurality of the beginning channel data blocks in order to increase the correction power of the resulting ECC codeword. For example when the ECC comprises a LDPC code, the correction power of the LDPC codeword increases when the first ECC redundancy bits (parity bits) as shown in FIG. 4A are generated over a larger segment of the beginning channel data.

Figure 5A:
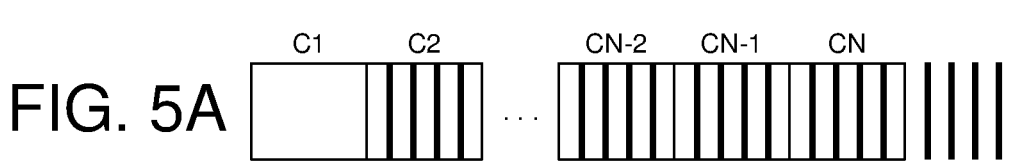
FIGS. 5A-5D show an embodiment wherein after decoding an ECC codeword, the codeword is channel decoded based on the ECC redundancy bits (i.e., inverse of the channel encoding).
Figure 5B:
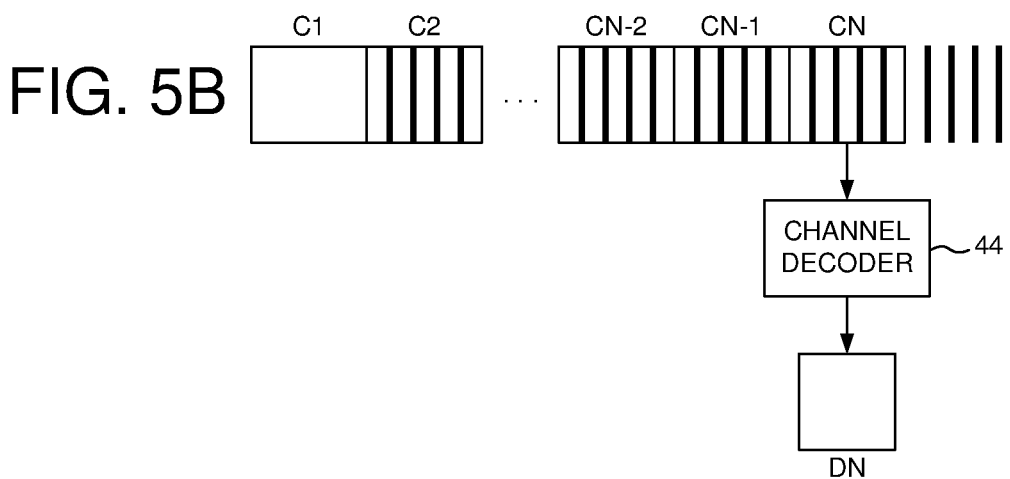
Figure 5C:
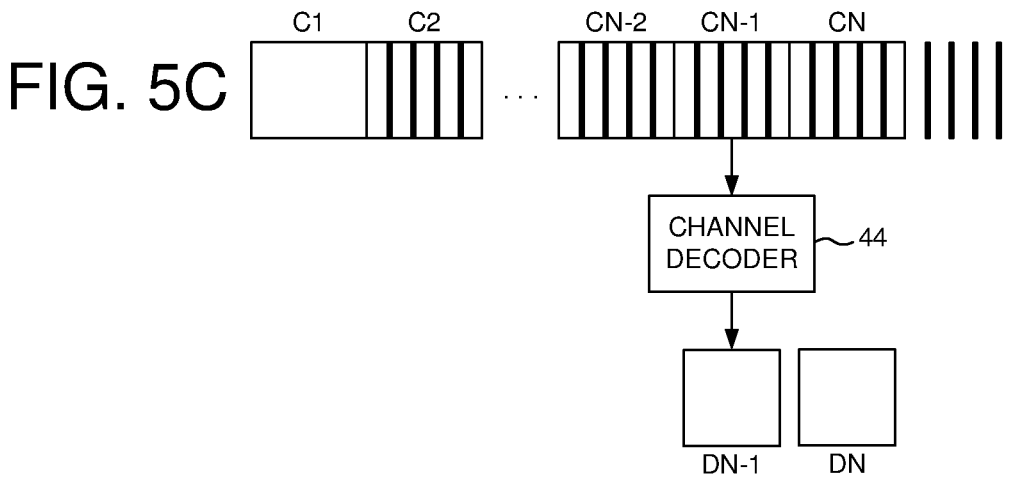
Figure 5D:
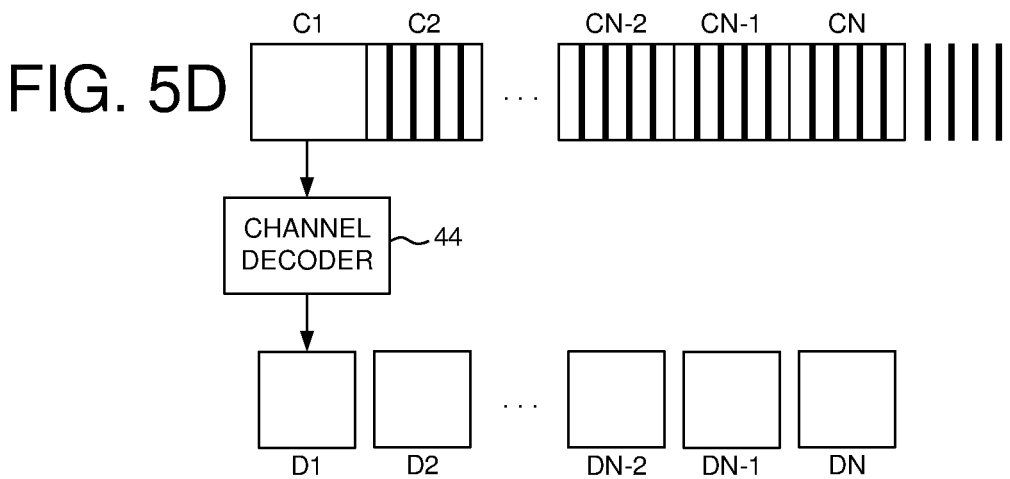

FIGS. 5A-5D show an example embodiment of channel decoding an ECC codeword after errors in the ECC codeword have been corrected by the ECC decoder 40. When the ECC codeword is read from the NVSM 8, the ECC redundancy bits are embedded in the detected channel blocks C1-CN as shown in FIG. 5A. Accordingly the ECC redundancy bits do not require any channel decoding prior to processing the ECC codeword with the ECC decoder 40. Once the ECC codeword has been successfully decoded by the ECC decoder 40 (by correcting any errors in the ECC codeword), the ECC redundancy bits are known and can therefore be used to channel decode the channel blocks into the output data 46 (matching the input data 24) by implementing the inverse of the channel encoder 26. In the embodiment of FIG. 5B, the channel decoding of the ECC codeword operates in reverse starting with the channel decoding of the last channel block CN into to data block DN. That is, the last channel block CN is decoded by a channel decoder 44 which implements the inverse of the channel encoder 26, including to decode based on the ECC redundancy bits embedded into the channel block CN. This process continues with the next to last channel block CN-1 as shown in FIG. 5C, and so on, until the first channel block C1 is decoded into the first data block D1.

In one embodiment, channel encoding/decoding based on the channel code constraint as well as based on the known ECC redundancy bits as described above increases the code rate of the channel code. For example, the channel encoder 26 shown in FIG. 2C could encode the input data 24 so as to leave "blank" bits in the resulting channel blocks, and then inserting the ECC redundancy bits into the "blank" bits. This would require the channel encoder 26 to encode the input data so that the channel code constraint would not be violated regardless as to the value of the ECC redundancy bits (i.e., the "blank" bits would be encoded as don't care bits). However, implementing a channel code to include "blank" or don't care bits would significantly reduce the code rate of the channel code, thereby significantly reducing the storage capacity of the NVSM 8.

Figure 6A:
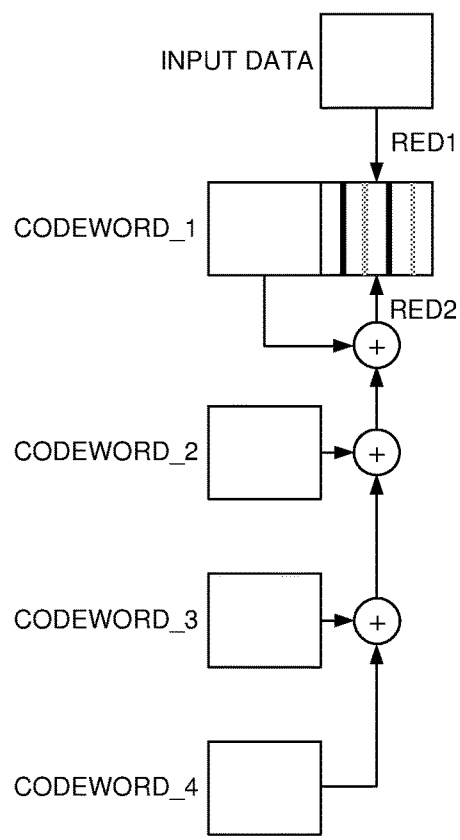
FIGS. 6A and 6B show an embodiment wherein parity bits of a parity sector are also encoded into the channel data by the channel encoder.
Figure 6B:
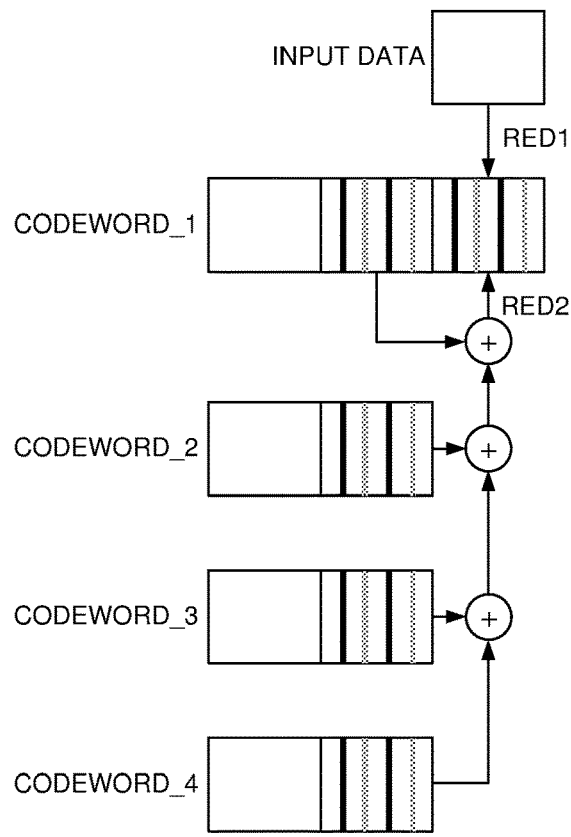

The ECC redundancy bits embedded into the channel blocks as described above may be generated in any suitable manner based on any suitable error correction code, including a one dimensional or two dimensional code. FIGS. 6A and 6B show an embodiment wherein ECC redundancy bits may be generated in two dimensions, including first ECC redundancy bits generated over a plurality of consecutive channel blocks to form an ECC codeword (e.g., an LDPC codeword) and second ECC redundancy bits generated over a plurality of the ECC codewords (e.g., a parity sector generated over a plurality of the ECC codewords). FIG. 6A shows a first block of a plurality of ECC codewords wherein the second block of the first ECC codeword is generated by channel encoding input data based on the channel code constraint as well as the first and second ECC redundancy bits. As shown in FIG. 6A, in this embodiment the second ECC redundancy bits are generated as the XOR of the bits in each of the first blocks of the plurality of ECC codewords. The first ECC redundancy bits (represented as black stripes) and at least part of the second ECC redundancy bits (represented as gray stripes) are embedded into the second block of the first ECC codeword by the channel encoder in a manner that does not violate the channel code constraint. FIG. 6B shows the encoding progression wherein the second ECC redundancy bits (e.g., the parity bits generated over the respective blocks of the ECC codewords) may be distributed across the ECC codewords. That is, each block of each ECC codeword may comprise the first ECC redundancy bits generated over the previous channel blocks of the codeword as well as a number of the second ECC redundancy bits generated over the respective blocks of the plurality of ECC codewords. During a read operation, the plurality of ECC codewords are read from the NVSM 8 as a block of codewords which are then decoded by the ECC decoder using the first and second ECC redundancy bits (e.g., a two dimensional decoding such as LDPC augmented by a parity sector). After the block of ECC codewords are successfully decoded, the channel decoder 44 decodes each block of each ECC codeword based on the known first and second embedded ECC redundancy bits as described above.

Figure 7A:
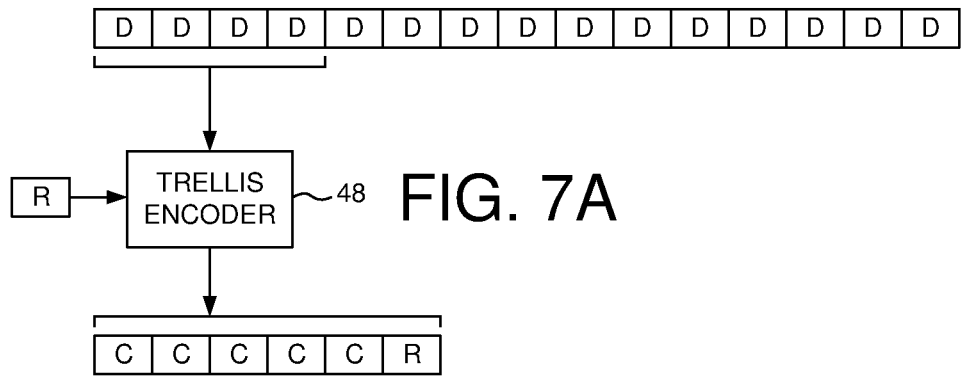
FIGS. 7A and 7B show an embodiment wherein the channel encoder comprises a trellis type encoder responsive to the ECC redundancy bits.
Figure 7B:
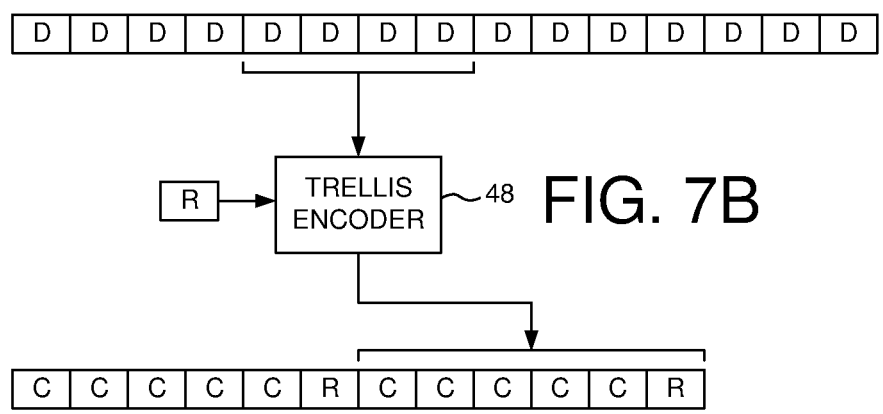

Any suitable channel encoder may be employed in the embodiments described above (e.g., channel encoder 26 in FIG. 2C) in order to encode the input data into the channel data, including to embed the ECC redundancy bits without violating the channel code constraints. FIG. 7A shows an embodiment wherein the channel encoder comprises a trellis-type encoder 48 that encodes the input data and ECC redundancy bits based on a state transition diagram. In one embodiment, the state transition diagram of the trellis is time-varying when encoding the known ECC redundancy bits. For example in an embodiment where a single ECC redundancy bit is encoded at a time, when the known ECC redundancy bit is a "1" bit, the branch of the state transition diagram corresponding to the "0" bit is deleted. FIG. 7A shows a progression of the encoding process wherein a current block of input data D is encoded by the trellis-type encoder 26 based on the channel code constraint and based on at least one ECC redundancy bit R that was generated over previously encoded channel data as described above. In this example the trellis-type encoder 26 embeds the ECC redundancy bit R the at the end of the channel block so as to not violate the channel code constraint. That is, the time-varying state transition diagram of the trellis-type encoder 26 is configured so that the resulting channel data (with embedded ECC redundancy bits) does not violate the channel code constraint. FIG. 7B shows a further progression of the encoding process wherein the next block of input data D is encoded by the trellis-type encoder 26 based on the channel code constraint and based on an least one ECC redundancy bit R that was generated over the previously encoded channel blocks as described above. Any suitable number of input data bits D as well as any suitable number of ECC redundancy bits R may be encoded by the trellis-type encoder 48 at each transition of the state transition diagram.

Figure 7C:
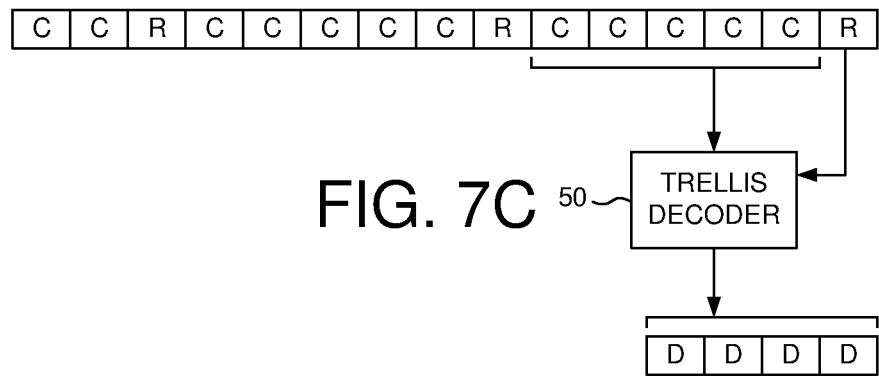
FIGS. 7C and 7D show an embodiment wherein the channel decoder comprises a trellis type decoder responsive to the ECC redundancy bits.
Figure 7D:
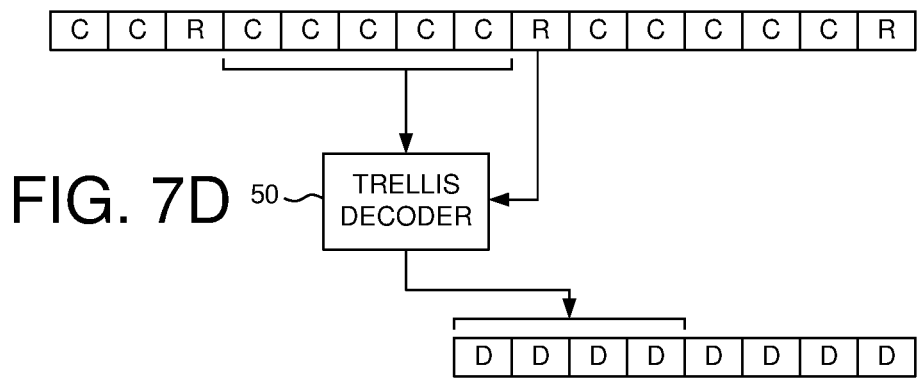

FIG. 7C shows an embodiment wherein the channel decoder (e.g., the channel decoder 44 of FIG. 2C) comprises a trellis-type decoder 50 that decodes the channel data and ECC redundancy bits based on a time-varying state transition diagram in order to implement the inverse encoding of the channel encoder. In this embodiment, the channel data is first processed by the ECC decoder to decode an ECC codeword using the ECC redundancy bits R such as shown in FIG. 2C. Once the ECC codeword is successfully decoded, errors in the channel data (including errors in the ECC redundancy bits) will have been corrected, thereby enabling accurate channel decoding since the ECC redundancy bits R are known similar to the encoding process. In the example of FIG. 7C, the channel decoding operates in the reverse order as the channel encoding, wherein the trellis-type decoder 50 first decodes the last channel block in an ECC codeword in response to the embedded ECC redundancy bit(s) R. FIG. 7D shows a further progression of the channel decoding wherein the next channel block in the ECC codeword is decoded in response to the embedded ECC redundancy bit(s) R, and so on, until the first channel block in the ECC codeword is decoded.

Figure 8:
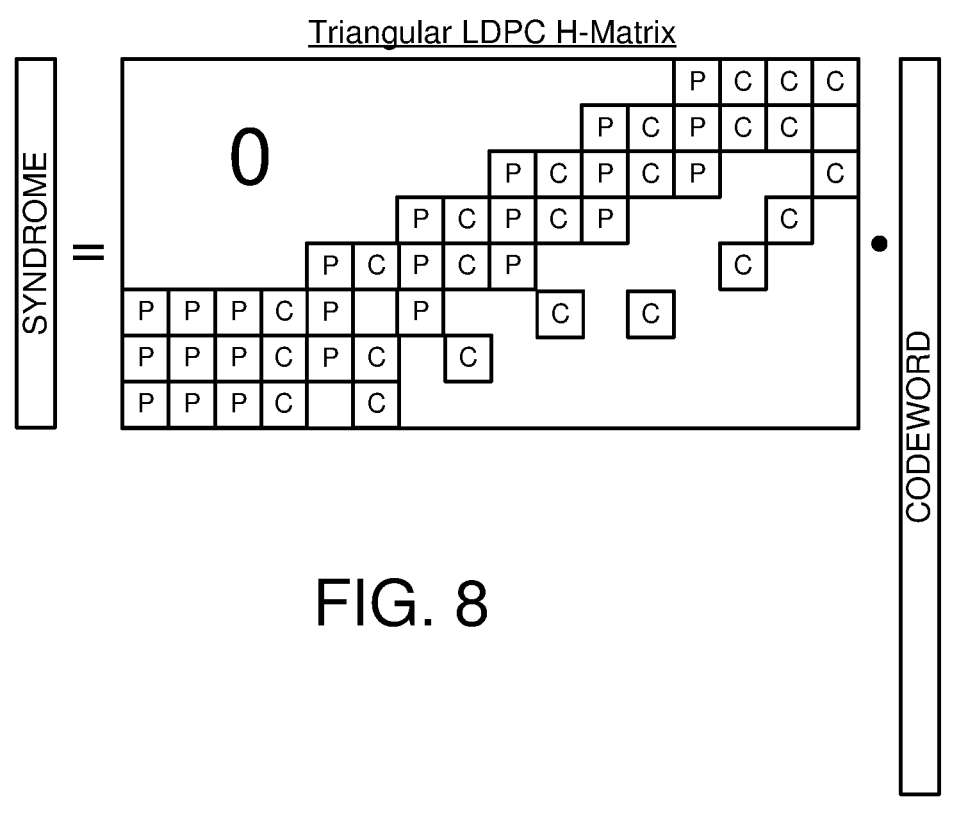

FIG. 8 shows an example of a triangular H-Matrix of an LDPC code corresponding to the encoding/decoding embodiment of FIGS. 4A-4E, wherein the channel blocks C are encoded into LDPC parity P over progressively larger segments of the channel data. At each progression of the LDPC encoding, the resulting LDPC parity P is embedded into the next encoded channel data block as described above, thereby embedding the LDPC parity P into the channel data without modification and without violating the channel code constraint.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the NVSM and read into a volatile semiconductor memory when the data storage device is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, solid state drives, hybrid drives, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-volatile storage medium (NVSM); and
control circuitry configured to:
channel encode a first block of first input data into first channel data based on a channel code constraint;
error correction encode the first channel data to generate first redundancy bits;
channel encode a second block of second input data into second channel data based on the channel code constraint and the first redundancy bits, the second channel data comprising the first redundancy bits;
error correction encode the first channel data and the second channel data to generate second redundancy bits;
channel encode a third block of third input data into third channel data based on the channel code constraint and the second redundancy bits, the third channel data comprising the second redundancy bits; and
store the first, second and third channel data and the first and second redundancy bits in the NVSM.

2. The data storage device as recited in claim 1, wherein the first redundancy bits are distributed across the second channel data.

3. The data storage device as recited in claim 1, wherein the control circuitry is further configured to:
read the first and second channel data and the first redundancy bits from the NVSM to generate read data;
error correction decode the read data to generate corrected data;
extract the first redundancy bits from the corrected data; and
channel decode the corrected data into the second block of second input data based on the extracted first redundancy bits.

4. The data storage device as recited in claim 1, wherein the channel code constraint is a maximum transition run (MTR) code constraint.

5. The data storage device as recited in claim 1, wherein the first and second redundancy bits are generated based on a low density parity check (LDPC) code.

6. The data storage device as recited in claim 1, wherein the control circuitry is further configured to:
channel encode a fourth block of fourth input data into fourth channel data based on the channel code constraint; and
generate third redundancy bits over the first channel data and the fourth channel data.

7. The data storage device as recited in claim 6, wherein the second channel data comprises the third redundancy bits.

8. A data storage device comprising:
a non-volatile storage medium (NVSM); and
control circuitry configured to:
generate first low density parity check (LDPC) parity over first input data;
generate the first input data as first channel data encoded based on a channel code constraint;
generate second LDPC parity over the first input data and over second input data, wherein the first and second input data and the first and second LDPC parity form at least part of an LDPC codeword;
generate the second input data as second channel data encoded based on the channel code constraint and the first LDPC parity; and
store the LDPC codeword in the NVSM.

9. The data storage device as recited in claim 8, wherein the second channel data comprises the first LDPC parity.

10. The data storage device as recited in claim 9, wherein the first LDPC parity is distributed across the second channel data.

11. The data storage device as recited in claim 8, wherein the control circuitry is further configured to:
read the LDPC codeword from the NVSM to generate read data;
error correction decode the read data to generate corrected data;
extract the first LDPC parity from the corrected data; and
channel decode the corrected data based on the extracted first LDPC parity.

12. The data storage device as recited in claim 8, wherein the channel code constraint is a maximum transition run (MTR) code constraint.

13. The data storage device as recited in claim 8, wherein the control circuitry is further configured to:
generate third channel data based on the channel code constraint; and
generate parity bits over the first channel data and the third channel data.

14. The data storage device as recited in claim 13, wherein the second channel data comprises the parity bits.

15. The data storage device as recited in claim 13, wherein the parity bits are distributed across the second channel data.

16. A data storage device comprising:
a non-volatile storage medium (NVSM); and
a means for generating first low density parity check (LDPC) parity over first input data;
a means for generating the first input data as first channel data encoded based on a channel code constraint;
a means for generating second LDPC parity over the first input data and over second input data, wherein the first and second input data and the first and second LDPC parity form at least part of an LDPC codeword;
a means for generating the second input data as second channel data encoded based on the channel code constraint and the first LDPC parity; and
a means for storing the LDPC codeword in the NVSM.

17. Control circuitry configured to access a non-volatile storage medium (NVSM), the control circuitry configured to:
channel encode a first block of first input data into first channel data based on a channel code constraint;
error correction encode the first channel data to generate first redundancy bits;

channel encode a second block of second input data into second channel data based on the channel code constraint and the first redundancy bits, the second block of second channel data comprising the first redundancy bits;

error correction encode the first channel data and the second channel data to generate second redundancy bits;

channel encode a third block of third input data into third channel data based on the channel code constraint and the second redundancy bits, the third channel data comprising the second redundancy bits; and store the first, second and third channel data and the first and second redundancy bits in the NVSM.

18. The control circuitry as recited in claim 17, wherein the first redundancy bits are distributed across the second channel data.

19. The control circuitry as recited in claim 17, wherein the control circuitry is further configured to:

read the first and second channel data and the first redundancy bits from the NVSM to generate read data;

error correction decode the read data to generate corrected data;

extract the first redundancy bits from the corrected data; and channel decode the corrected data into the second block of second input data based on the extracted first redundancy bits.

20. The control circuitry as recited in claim 17, wherein the channel code constraint is a maximum transition run (MTR) code constraint.

21. The control circuitry as recited in claim 17, wherein the first and second redundancy bits are generated based on a low density parity check (LDPC) code.

22. The control circuitry as recited in claim 17, wherein the control circuitry is further configured to:

channel encode a fourth block of fourth input data into fourth channel data based on the channel code constraint; and generate third redundancy bits over the first channel data and the fourth channel data.

23. The control circuitry as recited in claim 22, wherein the second channel data comprises the third redundancy bits.

24. The control circuitry as recited in claim 22, wherein the third redundancy bits consist of parity bits generated over the first channel data and the fourth channel data.

* * * * *